United States Patent
So et al.

(10) Patent No.: US 10,701,834 B2
(45) Date of Patent: Jun. 30, 2020

(54) INFORMATION PROCESSING APPARATUS

(71) Applicant: FUJITSU LIMITED, Kawasaki-shi, Kanagawa (JP)

(72) Inventors: Tsuyoshi So, Kawasaki (JP); Osamu Aizawa, Kasiwa (JP); Nobumitsu Aoki, Kawasaki (JP); Koji Nakagawa, Kawasaki (JP); Keita Hirai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/139,115

(22) Filed: Sep. 24, 2018

(65) Prior Publication Data

US 2019/0104646 A1    Apr. 4, 2019

(30) Foreign Application Priority Data

Sep. 29, 2017  (JP) .................................. 2017-191388

(51) Int. Cl.
H05K 7/20 (2006.01)

(52) U.S. Cl.
CPC ..... *H05K 7/20645* (2013.01); *H05K 7/20263* (2013.01); *H05K 7/20272* (2013.01); *H05K 7/20727* (2013.01); *H05K 7/20772* (2013.01)

(58) Field of Classification Search
CPC ........... H05K 7/20645; H05K 7/20263; H05K 7/20272
See application file for complete search history.

(56) References Cited

U.S. PATENT DOCUMENTS

| | | | |
|---|---|---|---|
| 2004/0050231 A1* | 3/2004 | Chu | H05K 7/2079 83/574 |
| 2011/0041541 A1* | 2/2011 | Yoon | F24F 1/32 62/324.5 |
| 2011/0259551 A1* | 10/2011 | Kasai | F25B 39/028 165/100 |
| 2013/0014540 A1 | 1/2013 | Michitsuji | |
| 2015/0296659 A1* | 10/2015 | Desiano | H05K 7/20772 361/701 |
| 2016/0123645 A1* | 5/2016 | Kim | F25B 49/02 62/115 |
| 2017/0049009 A1* | 2/2017 | Steinke | H05K 7/20781 |
| 2017/0234587 A1* | 8/2017 | Jindou | F28F 9/02 62/527 |
| 2018/0135901 A1* | 5/2018 | Hirai | H05K 7/20272 |

FOREIGN PATENT DOCUMENTS

| | | |
|---|---|---|
| JP | 2001-343174 | 12/2001 |
| JP | 2011-247571 | 12/2011 |

* cited by examiner

*Primary Examiner* — James Wu
*Assistant Examiner* — Michael A Matey
(74) *Attorney, Agent, or Firm* — Fujitsu Patent Center

(57) ABSTRACT

An information processing apparatus includes a plurality of electronic apparatus stacked over a plurality of hierarchies in the information processing apparatus, a heat exchanger that cools refrigerant liquid for cooling the plurality of electronic apparatus, a first distributor that distributes the refrigerant liquid from the heat exchanger to the plurality of hierarchies, a plurality of second distributor that stores the refrigerant liquid temporarily, and a plurality of pipes that branched from the distribution pipes to the plurality of the electronic apparatus, wherein the number of the second distributor increases toward a hierarchy on downstream side, the pipes of the last hierarchy are coupled to the electronic apparatus.

3 Claims, 10 Drawing Sheets

INFORMATION PROCESSING APPARATUS

CROSS-REFERENCE TO RELATED APPLICATION

This application is based upon and claims the benefit of priority of the prior Japanese Patent Application No. 2017-191388, filed on Sep. 29, 2017, the entire contents of which are incorporated herein by reference.

FIELD

The embodiment discussed herein is related to an information processing apparatus that includes a distributer for distributing refrigerant liquid.

BACKGROUND

In an information processing apparatus such as a server apparatus or the like, in order to cool a built-in electronic apparatus and so forth, refrigerant liquid is supplied into the inside of the information processing apparatus using a metal pipe, a resin hose or the like by a refrigerant liquid supplying apparatus. In a server apparatus, a plurality of electronic apparatus including a central processing unit (hereinafter referred to as CPU) are incorporated, and refrigerant liquid is distributed to cool the electronic apparatus. The distribution of the refrigerant liquid is performed by a distributing device (multi branch pipe; also called manifold) in which distribution paths such as a plurality of hoses or the like are coupled to one thick pipe.

However, as the number of electronic apparatus incorporated in the server apparatus increases, the pipe length of the distributing device increases in order to distribute refrigerant liquid uniformly to the electronic apparatus. Therefore, there is a subject that the mounting space for the distributing device increases.

The following is a reference document.
[Document 1] Japanese Laid-open Patent Publication No. 2001-343174.

SUMMARY

According to an aspect of the embodiment, an information processing apparatus includes a plurality of electronic apparatus stacked over a plurality of hierarchies in the information processing apparatus, a heat exchanger that cools refrigerant liquid for cooling the plurality of electronic apparatus, a first distributor that distributes the refrigerant liquid from the heat exchanger to the plurality of hierarchies, a plurality of second distributor that stores the refrigerant liquid temporarily, and a plurality of pipes that branched from the distribution pipes to the plurality of the electronic apparatus, wherein the number of the second distributor increases toward a hierarchy on downstream side, the pipes of the last hierarchy are coupled to the electronic apparatus, and where the total number of branches to which the first distributor distributes the refrigerant liquid is represented by R and the number of hierarchies is represented by T, the number BN of branches that are branched from the second distributor of the Nth hierarchy is defined by the following expression:

$$BN \approx R^{(1/T)} \ldots ((1/T)th\text{power of }R)$$

where BN, R and T are integers equal to or greater than 2.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Figure 1:
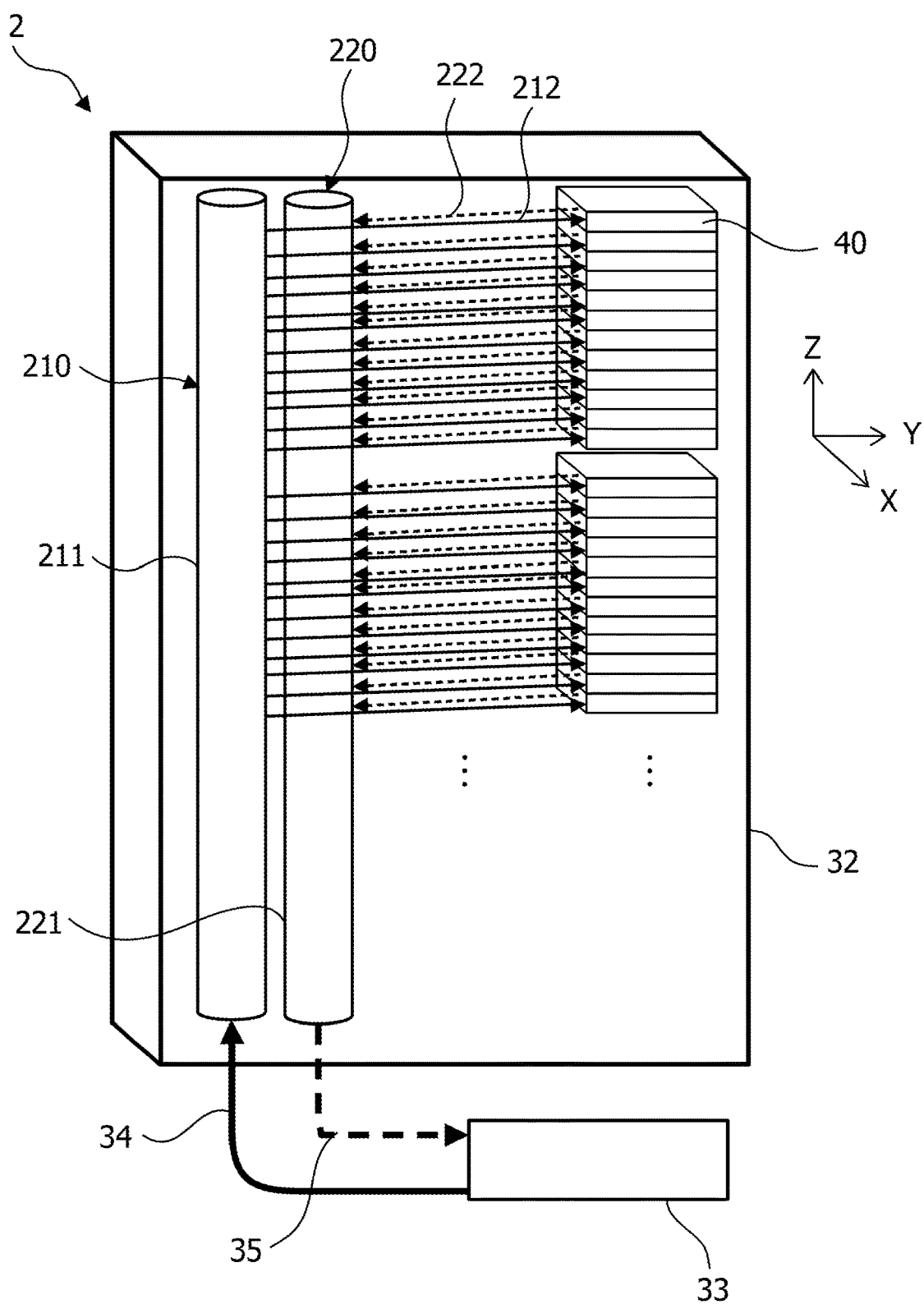
FIG. 1 is a schematic view schematically depicting an information processing apparatus that includes a distributing device and a confluence device according to a comparative technology.

In the following, an embodiment of the present application is described in detail based on particular working examples with reference to the drawings. Further, same or like elements in the embodiment are denoted by like reference characters, and, in order to facilitate understandings, the scale is suitably changed among the drawings.

First, a server apparatus that is an example of an information processing apparatus according to a comparative technology is described. FIG. 1 is a schematic view schematically depicting the server apparatus 2 according to the comparative technology. The server apparatus 2 includes a plurality of electronic apparatus 40 each including a CPU, a heat exchanger 33, a distributing device 210 for distributing refrigerant liquid and a confluence device 220 for collecting the refrigerant liquid that has cooled the electronic apparatus 40 in a housing 32.

The distributing device 210 is coupled to the heat exchanger 33 through a feed water pipe 34 such that refrigerant liquid flows from the heat exchanger 33 into the distributing device 210 through the feed water pipe 34. The heat exchanger 33 serves also as a refrigerant liquid supplying unit and has a function as a pump for feeding the refrigerant liquid to the distributing device 210.

The distributing device 210 is a device for distributing refrigerant liquid fed from the heat exchanger 33 to the electronic apparatus 40, and includes a distribution pipe 211 into which the refrigerant liquid flows and a distribution communication pipe 212 that serves as a communication path between the distribution pipe 211 and the electronic apparatus 40. It is to be noted that, in FIG. 1, the distribution communication pipe 212 is indicated by a solid line and a flowing method of the refrigerant liquid is indicated by an arrow mark. The distribution pipe 211 includes one inflow port coupled to the feed water pipe 34 and a number of outflow ports substantially equal to that of the electronic apparatus 40. The distribution communication pipe 212 is, for example, a hose made of resin. The distribution communication pipe 212 is coupled to an outflow port provided on the distribution pipe 211 and an inflow port provided on each of the electronic apparatus 40. Cooling water flowing into the distributing device 210 from the heat exchanger 33 through the feed water pipe 34 is stored in the distribution pipe 211 and is distributed to each of the electronic apparatus 40 through the distribution communication pipe 212.

The confluence device 220 includes a confluence pipe 221 and confluence communication pipes 222 that serve as communication paths between the electronic apparatus 40 and the confluence pipe 221. In FIG. 1, the confluence communication pipes 222 are indicated each by a dotted line and a flowing direction of refrigerant liquid is indicated by an arrow mark. The cooling water flowing out from the electronic apparatus 40 is collected into the confluence pipe 221 through the confluence communication pipes 222. The cooling water collected in the confluence pipe 221 flows into the heat exchanger 33 from the confluence pipe 221 through a drain pipe 35. The cooling water heated by the electronic apparatus 40 is cooled again by the heat exchanger 33 and is sent again to the distributing device 210 by the heat exchanger 33. In this manner, the cooling water is circulated in order to cool the electronic apparatus 40 in the server apparatus 2.

The structure for distributing refrigerant liquid to the electronic apparatus 40 using the distribution pipe 211 branching to the plurality of distribution communication pipes 212 is effective as a countermeasure for supplying refrigerant liquid having an isothermal temperature and a uniform flow rate to the plurality of electronic apparatus 40. However, an increasing number of electronic apparatus 40 including a CPU are incorporated together with increase of the performance of the server apparatus 2, and there is a subject that the size of the server apparatus 2 is increased by such factors as described below.

(1) Since the one distribution pipe 211 is branched so as to be coupled to the plurality of electronic apparatus 40, the length of the distribution pipe 211 increases as the number of such electronic apparatus 40 increases. On the other hand, in order to suppress pressure loss by a difference in distance from the inflow port of the distribution pipe 211 to the electronic apparatus 40 (hereinafter referred to as distribution path), it is desirable to make the lengths of the distribution paths substantially equal to each other. Therefore, the length of all of the distribution communication pipes 212 is obliged to be adjusted to the length of the distribution communication pipe 212 that has the greatest length, and a greater mounting space may be required.

(2) Since pressure loss by increase of the distance from the inflow port of the distribution pipe 211 to each outflow port of the distribution pipe 211 causes decrease of the flow rate, in order to reduce the difference in pressure loss, it is demanded to further increase the diameter of the distribution pipe 211.

In the structure of the distributing device 210 and the confluence device 220 according to the comparative technology, from the reasons described above, the mounting space for the electronic apparatus 40 increases as the number of such electronic apparatus 40 to be cooled increases. On the other hand, the installation area of the server apparatus is limited in many cases, and it is difficult to increase the occupation area for the distributing device 210 and the confluence device 220. Therefore, a distributing device and a confluence device of a smaller size that have a reduced mounting space are demanded.

Figure 2:
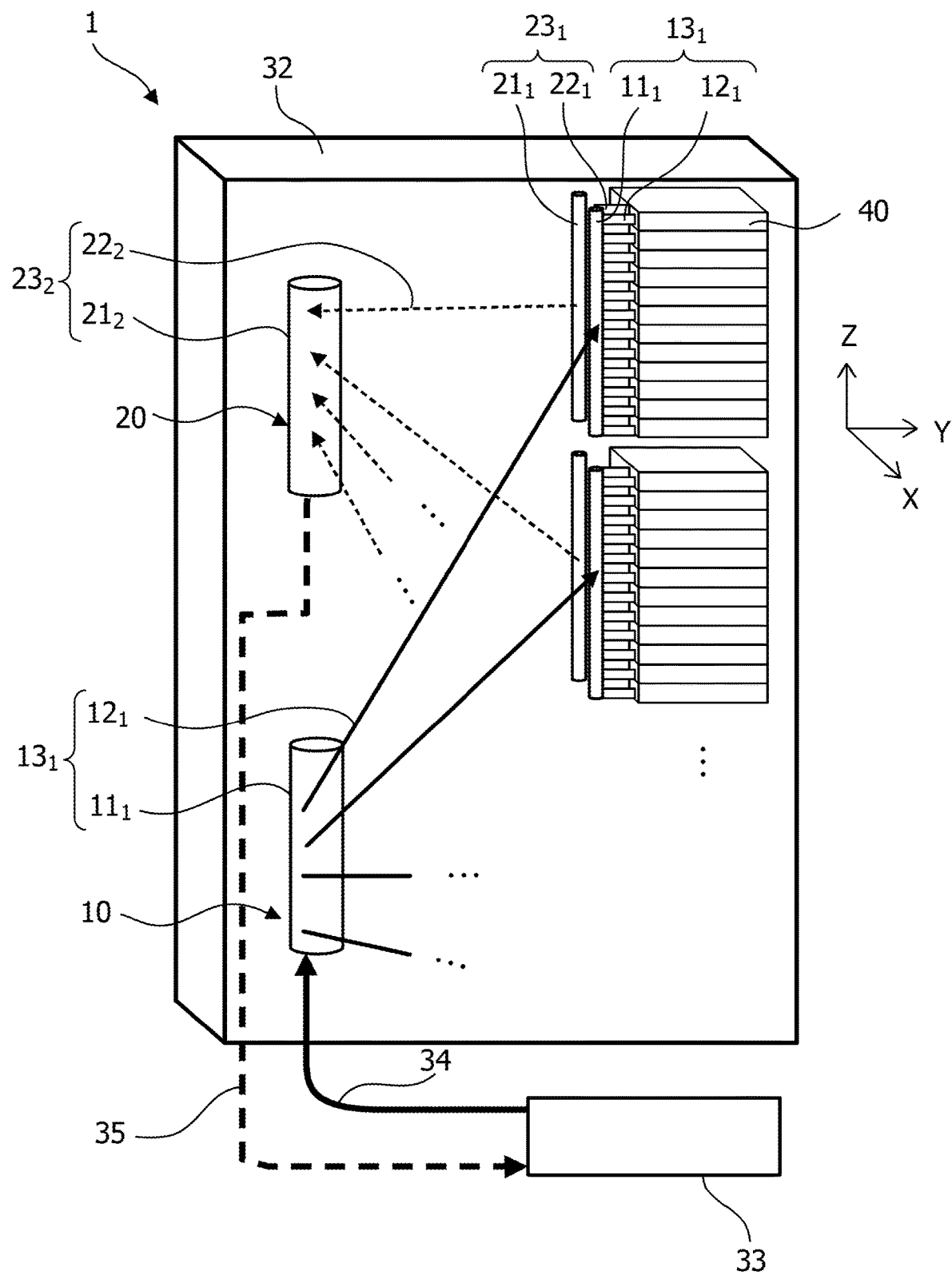
FIG. 2 is a schematic view schematically depicting an information processing apparatus that includes a distributing device and a confluence device disclosed herein.
Figure 3:
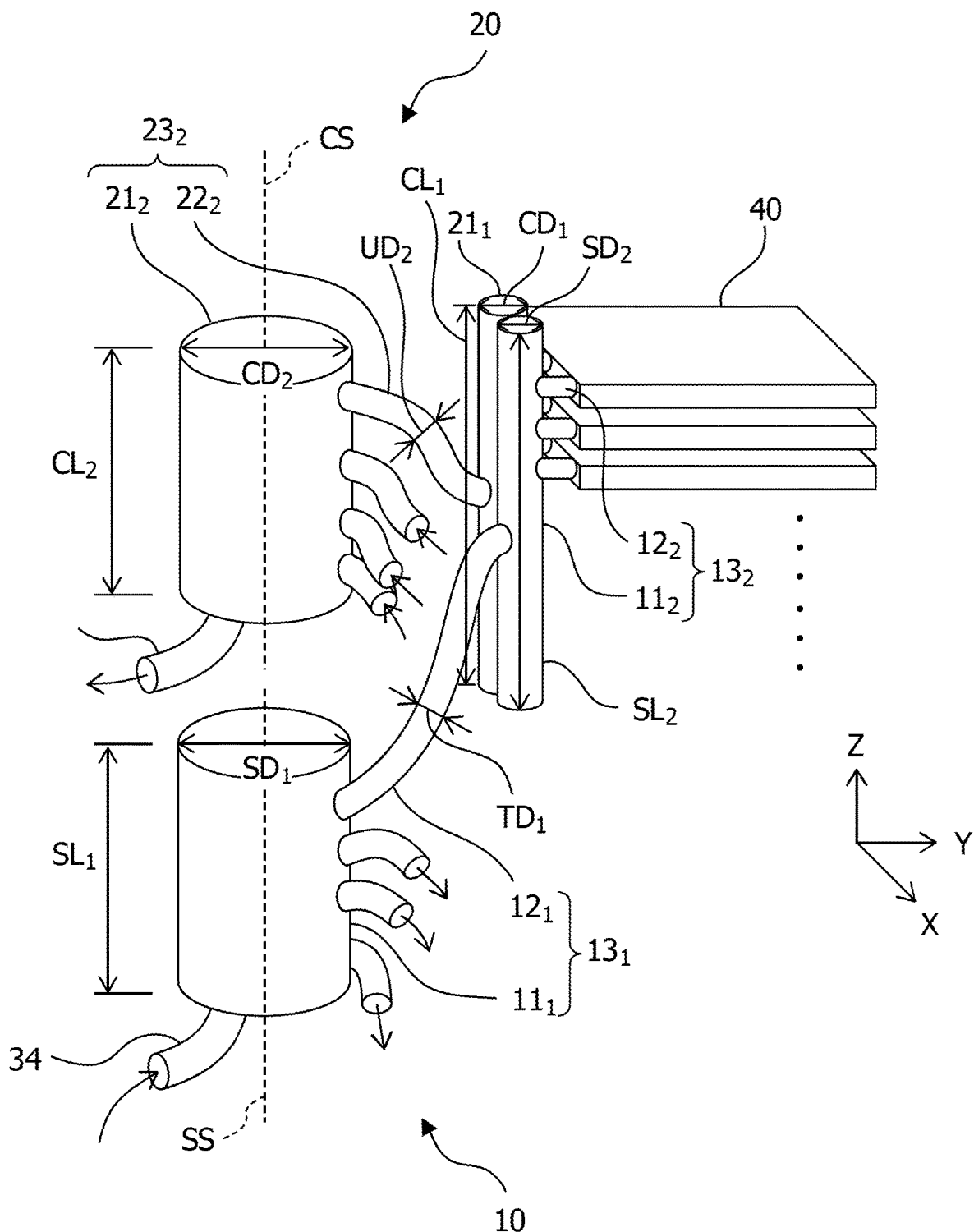
FIG. 3 is a perspective view depicting part of a distributing device and a confluence device.

FIG. 2 is a schematic view schematically depicting a server apparatus 1 that is an example of an information processing apparatus of the present embodiment. FIG. 3 is a perspective view depicting part of the distributing device and the confluence device. A Z axis depicted in FIGS. 2 and 3 indicates a heightwise direction of the server apparatus 1. The server apparatus 1 includes a plurality of electronic apparatus 40 individually including a CPU and a heat exchanger 33 similarly to the server apparatus 2 depicted in FIG. 1. The server apparatus 1 includes a distributing device 10 that distributes refrigerant liquid sent thereto from the heat exchanger 33 through a feed water pipe 34 to the individual electronic apparatus 40 and a confluence device 20 that collects the refrigerant liquid after cooling the electronic apparatus 40.

As depicted in FIGS. 2 and 3, the distributing device 10 of the present embodiment has a two-stage hierarchical structure and two distribution layer distributing devices $13_1$ and $13_2$ (a plurality of distribution layer distributing devices are hereinafter referred to sometimes simply as distribution layer distributing device 13) are coupled.

For example, the distributing device 10 includes a first distribution layer distributing device $13_1$ that distributes refrigerant liquid from the feed water pipe 34 and a second distribution layer distributing device $13_2$ that is coupled to the first distribution layer distributing device $13_1$ and further distributes the refrigerant liquid. The first distribution layer distributing device $13_1$ includes a distribution pipe $11_1$ that temporarily stores the refrigerant liquid and a plurality of distribution communication pipes $12_1$ branched from the distribution pipe $11_1$. It is to be noted that the distribution communication pipe $12_1$ is indicated by an arrow mark of a solid line in FIG. 2 and a flowing direction of the refrigerant liquid is indicated by an arrow mark. Further, the second distribution layer distributing device $13_2$ includes a distribution pipe $11_2$ coupled to the distribution communication pipe $12_1$ of the first distribution layer distributing device $13_1$ and a plurality of distribution communication pipes $12_2$ branched from the distribution pipe $11_2$. The plurality of distribution communication pipes $12_2$ of the second distribution layer distributing device $13_2$ are individually coupled to the electronic apparatus 40. It is to be noted that, in the following description, the pluralities of distribution pipes $11_1$ and $11_2$ are each referred to sometimes as distribution pipe 11 and the pluralities of distribution communication pipes $12_1$ and $12_2$ are each referred to sometimes as distribution communication pipe 12.

The heat exchanger 33 is coupled to the distribution pipe $11_1$ in the first distribution layer distributing device $13_1$ through the feed water pipe 34, and the distribution pipe $11_1$ is branched to four distribution communication pipes $12_1$. A plurality of outflow ports is provided for one inflow port on the distribution pipe $11_1$. The distribution communication pipe $12_1$ of the first distribution layer distributing device $13_1$ on the upstream side is coupled to the distribution pipes $11_2$ of the second distribution layer distributing device $13_2$ on the downstream side. The distribution communication pipe $12_1$ includes one outflow port provided for one inflow port thereon. Each distribution pipe $11_2$ of the second distribution layer distributing device $13_2$ is branched to a plurality of distribution communication pipes $12_2$ and each of the distribution communication pipes $12_2$ is coupled to an inflow port 47 (refer to FIG. 4) of the electronic apparatus 40.

As depicted in FIG. 3, the diameter $TD_1$ of the distribution communication pipe $12_1$ of the first distribution layer distributing device $13_1$ is formed smaller than the diameter $SD_1$ of the distribution pipe $11_1$ of the first distribution layer distributing device $13_1$. Further, the diameter $SD_2$ of the distribution pipe $11_2$ of the second distribution layer distributing device $13_2$ on the downstream side is formed smaller than the diameter $SD_1$ of the distribution pipe $11_1$ of the first distribution layer distributing device $13_1$ on the upstream side. It is to be noted here that the diameter signifies an inner diameter.

In the case where a single distribution pipe is used as in the server apparatus 2 of the comparative technology, the distribution pipe is branched so as to distribute refrigerant liquid to all electronic apparatus. On the other hand, if the distributing device 10 is configured so as to have a hierarchical structure as in the server apparatus 1 of the present embodiment, the number of branches of each distribution pipe 11 may be decreased. Since the number of branches decreases, all of the distribution communication pipes 12 may be configured long in order to reduce the pressure loss. Therefore, the space occupancy of the distribution communication pipe 12 may be decreased. Further, since the flow rate of the distribution pipe 11 per one pipe decreases, the diameter SD of the distribution pipes 11 may be reduced further. Therefore, the distributing device 10 may be downsized as a whole and the cost of parts may be reduced.

The confluence device 20 of the server apparatus 1 of the present embodiment is described. The confluence device 20 has a hierarchical structure as depicted in FIGS. 2 and 3 similarly to the distributing device 10. The confluence device 20 depicted in FIG. 2 includes two-hierarchy confluence layer confluence devices $23_1$ and $23_2$. The confluence layer confluence device $23_1$ includes confluence pipes $21_1$ and $21_2$ and confluence communication pipes $22_1$ and $22_2$ (in FIG. 2, they are indicated by an arrow mark of a dotted line and a flowing direction of refrigerant liquid is indicated by an arrow mark). In the confluence device 20 depicted in FIG. 2, refrigerant liquid exhausted from the electronic apparatus 40 is accumulated into the confluence pipe $21_1$ through the confluence communication pipe $22_1$. The refrigerant liquid accumulated temporarily flows into the confluence pipe $21_2$ of the second confluence layer confluence device $23_2$ on the downstream side through the confluence communication pipe $22_2$. The refrigerant liquid collected in the confluence pipe $21_2$ flows into the heat exchanger 33 through the drain pipe 35.

As depicted in FIG. 3, the diameter $CD_2$ of the confluence pipe $21_2$ of the second confluence layer confluence device $23_2$ is formed greater than the diameter $CD_1$ of the confluence pipe $21_1$ of the first confluence layer confluence device $23_1$. Further, the diameter $UD_1$ of the confluence communication pipe $22_1$ of the first confluence layer confluence device $23_1$ is formed smaller than the diameter $CD_1$ of the confluence pipe $21_1$ of the first hierarchy. By division for each hierarchy, the amount of the refrigerant liquid to flow into the confluence pipe $21_1$ on the upstream side becomes smaller, and the diameter $CD_1$ of the confluence pipe $21_1$ of the first confluence layer confluence device $23_1$ may be formed smaller than the diameter $CD_2$ of the confluence pipe $21_2$ of the second confluence layer confluence device $23_2$.

Figure 4:
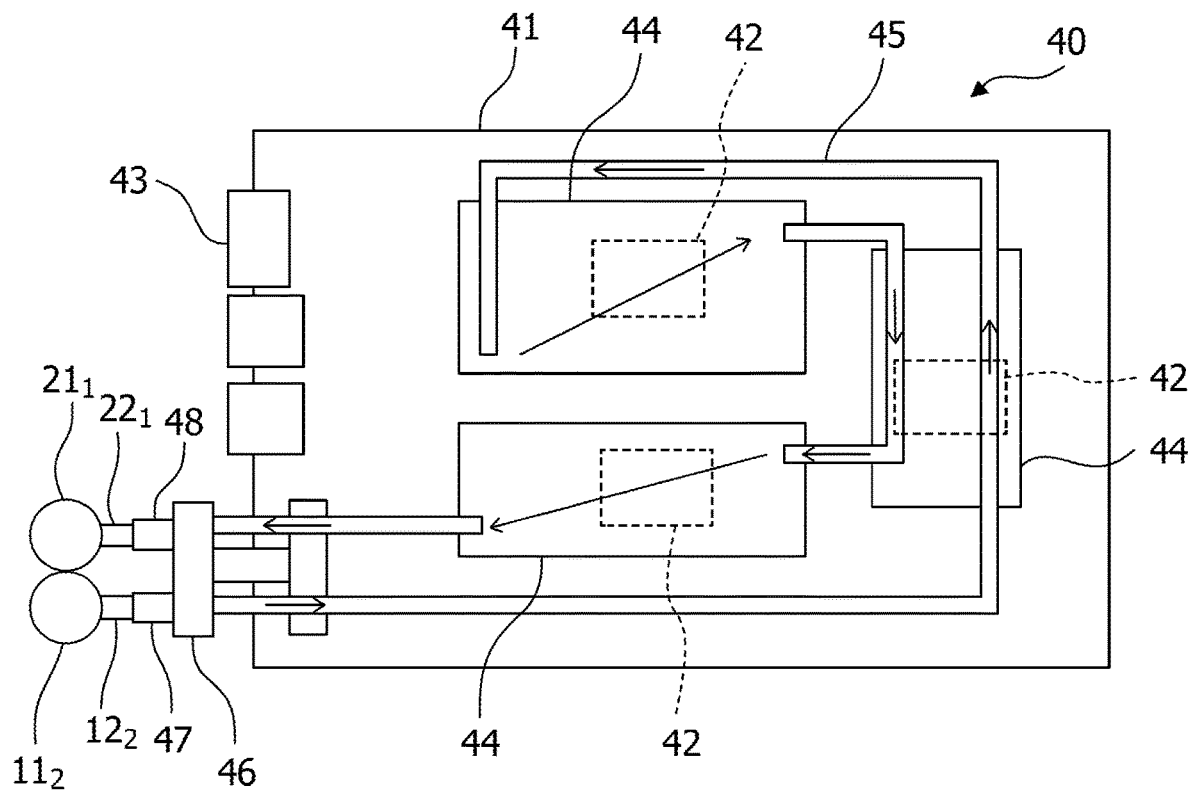
FIG. 4 is a top plan view depicting an electronic apparatus cooled by refrigerant liquid.

FIG. 4 is a top plan view depicting the electronic apparatus 40 incorporated in the server apparatus 2 of the present embodiment. As depicted in FIG. 4, in the electronic apparatus 40, a plurality of integrated circuits 42 such as a CPU and so forth are mounted on a printed board 41. Further, an electric connector 43 for coupling to some other electronic apparatus or the like is provided at an end portion of the printed board 41. A cold plate 44 for cooling the integrated circuit 42 is attached to each integrated circuit 42 that is a heat generating member. A pipe 45 along which refrigerant liquid flows is disposed so as to effectively cool the cold plate 44 on the integrated circuit 42. Further, a coupler 46 for coupling to the distribution communication pipes $12_2$ of the distributing device 10 and the confluence communication pipes $22_1$ of the confluence device 20 are provided on the electronic apparatus 40. The coupler 46 includes an inflow port 47 and an outflow port 48, and end portions of the pipe 45 along which refrigerant liquid flows are coupled to the inflow port 47 and the outflow port 48. By fitting the inflow port 47 and the outflow port 48 provided on the coupler 46 with the distribution communication pipe $12_2$ and the confluence communication pipe $22_1$, respectively, the electronic apparatus 40 may be attached readily to the distributing device 10 and the confluence device 20. The refrigerant liquid flows in the pipe 45 in accordance with an arrow mark depicted in FIG. 4.

The size of the distributing device 210 and the confluence device 220 of the server apparatus 2 according to the comparative technology depicted in FIG. 1 and the size of the distributing device 10 and the confluence device 20 of the server apparatus 1 depicted in FIG. 2 are compared with each other through a working example. In the working example, the size of a distributing device and a confluence device for cooling 96 electronic apparatus 40 is indicated. The distributing device 10 of the server apparatus 1 has two hierarchies as depicted in FIG. 2. Further, eight distribution communication pipe $12_1$ are coupled to the distribution pipe $11_1$ of the first distribution layer distributing device $13_1$ so as to branch the refrigerant liquid into eight branches. Then, the distribution pipes $11_2$ of the second distribution layer distributing devices $13_2$ are individually coupled to the distribution communication pipes $12_1$. For example, in the second distribution layer distributing device $13_2$, the eight distribution pipes $11_2$ are provided. Each of the distribution pipes $11_2$ of the second distribution layer distributing device $13_2$ is branched into 12 branches, to which the electronic apparatus 40 depicted in FIG. 4 is coupled. By arranging 12 electronic apparatus 40 in parallel as depicted in FIG. 2 with respect to one distribution pipe $11_2$ and arranging the inflow ports 47 of them in a line, the electronic apparatus 40 are directly coupled without using a hose or the like separately.

The diameter $SD_1$ and the length $SL_1$ in the longitudinal direction of each distribution pipe $11_1$ of the first distribution layer distributing device $13_1$ is set to 45 mm and 400 mm, respectively. Thus, in order to set the diameter $SD_2$ of each distribution pipe $11_2$ of the second distribution layer distributing device $13_2$, the following expression is used:

$$SD_2 = SD_1 \sqrt{SN_1} \qquad \text{(Expression 1)}$$

where $SD_2$ is the diameter of the distribution pipe $11_2$ of the second distribution layer distributing device $13_2$; $SD_1$ the diameter of the distribution pipe $11_1$ of the first distribution layer distributing device $13_1$; and $SN_1$ the number of branches from the distribution pipe $11_1$ of the first distribution layer distributing device $13_1$ to the distribution pipes $11_2$ of the second distribution layer distributing device $13_2$.

In the working example, since refrigerant liquid is branched from the distribution pipe $11_1$ of the first distribution layer distributing device $13_1$ to eight second distribution layer distributing devices $13_2$, the flow rate passing each distribution pipe $11_2$ of the second distribution layer distributing device $13_2$ is ⅛ the flow rate passing the distribution pipe $11_1$ of the first distribution layer distributing device $13_1$. In order to suppress the pressure loss in the distribution pipes $11_2$ to a same level as that of the distribution pipe $11_1$, the cross sectional area of the distribution pipes $11_2$ of the second distribution layer distributing device $13_2$ is set to approximately ⅛ the cross sectional area of the distribution pipe of the first distribution layer distributing device $13_1$ like the flow rate. In short, the ratio in cross sectional area is ⅛ and the ratio in inner diameter is √(⅛). If the circulation and the cost are taken into consideration with the foregoing taken into consideration, the diameter $SD_2$ of the distribution pipe $11_2$ of the second hierarchy may be set to 20 mm and the pipe length $SL_2$ may be set to 400 mm. Further, the diameter and the length of the distribution communication pipe $12_1$ (hose) for coupling the distribution pipe $11_1$ of the first distribution layer distributing device $13_1$ and the distribution pipe $11_2$ of the second distribution layer distributing device $13_2$ to each other are set to 15 mm and 1500 mm, respectively. Further, since the confluence device 20 collects cooling water having flowed into the electronic apparatus 40 from the distributing device 10, it is formed in like dimensions. It is to be noted that the diameter $CD_1$ and the pipe length $CL_1$ of each confluence pipe $21_1$ of the first confluence layer confluence device $23_1$ are set to 20 mm and 400 mm, and the diameter $CD_2$ and the pipe length $CL_2$ of the confluence pipe $21_2$ of the second confluence layer confluence device $23_2$ are set to 45 mm and 400 mm, respectively. Further, the diameter and the length of each confluence communication pipe $22_2$ are set to 15 mm and 1500 mm, respectively.

Volumes in the case where the distributing device 10 and the confluence device 20 are produced with the dimensions given above are depicted in Table 1.

TABLE 1

| | | Pipe diameter (mm) | Pipe sectional area (mm²) | Pipe length (mm) | Pipe volume/ one pipe (mm³) | Number of pipes | Pipe volume (mm³) |
|---|---|---|---|---|---|---|---|
| Distributing device | Distribution pipe of first distribution layer distributing device | 45 | 1590.4 | 400 | 636,172.5 | 1 | 636,172.5 |
| | Distribution pipe of second distribution layer distributing device | 20 | 314.2 | 400 | 125,663.7 | 12 | 1,507,964.5 |
| | Distribution communication pipe of first distribution layer distributing device | 15 | 176.7 | 1500 | 265,071.9 | 8 | 2,120,575.0 |
| Confluence device | Confluence pipe of first confluence layer confluence device | 20 | 314.2 | 400 | 125,663.7 | 12 | 1,507,964.5 |
| | Confluence pipe of second confluence layer confluence device | 45 | 1590.4 | 400 | 636,172.5 | 1 | 636,172.5 |
| | Confluence communication pipe of second confluence layer confluence device | 15 | 176.7 | 1500 | 265,071.9 | 8 | 2,120,575.0 |
| | Total volume | | | | | | 8,529,424 |

In the case where refrigerant liquid is distributed to 96 electronic apparatus 40 by the distributing device 210 of the comparative technology depicted in FIG. 1, it is demanded to set the cross sectional area of the distributing device 210 to four times or more the cross sectional area of the distribution pipe $11_1$ of the first distribution layer distributing device $13_1$. Therefore, the diameter and the length of the distribution pipe 211 were set to 90 mm and 1600 mm, respectively. Further, the diameter and the length of the distribution communication pipe 212 (hose) that couples from the distributing device 210 to the electronic apparatus 40 were set to 10 mm and 500 mm, respectively. Also the confluence device 220 that collects cooling water that has cooled the electronic apparatus 40 is provided with similar dimensions to those of the distributing device 210. For example, the diameter and the pipe length of the confluence pipe 221 are set to 90 mm and 1600 mm, respectively, and the diameter and the pipe length of the confluence communication pipe 222 are set to 10 mm and 500 mm, respectively.

Volumes in the case where a distributing device and a confluence device were produced with the dimensions given above are depicted in Table 2.

TABLE 2

| | | Pipe diameter (mm) | Pipe sectional area (mm²) | Pipe length (mm) | Pipe volume/ one pipe (mm³) | Number of pipes | Pipe volume (mm³) |
|---|---|---|---|---|---|---|---|
| Distributing device | Distribution pipe | 90 | 3,361.7 | 1600 | 10,178,760.2 | 1 | 10,178,760.2 |
| | Distribution communication pipe | 10 | 78.5 | 500 | 39,269.9 | 96 | 3,769,911.2 |
| Confluence device | Confluence pipe | 90 | 6,361.7 | 1600 | 10,178,760.2 | 1 | 10,178,760.2 |
| | Confluence communication pipe | 10 | 78.5 | 500 | 39,269.9 | 96 | 3,769,911.2 |
| | Total volume | | | | | | 27,897,342.8 |

If the volumes of the distributing device 10 and the confluence device 20 of the server apparatus 1 of the present embodiment depicted in Table 1 and the grand total of volumes for the distributing device 210 and the confluence device 220 of the server apparatus 2 of the comparative technology are compared with each other, it may be recognized that the volumes may be suppressed to approximately ⅓. Therefore, if the server apparatus 1 of the present embodiment is used, while refrigerant liquid may be distributed to many electronic apparatus 40 and is collected, also the pressure loss may be suppressed to a similar level to that of the server apparatus 2 of the comparative technology. For example, with the server apparatus 1 of the present embodiment, while the cooling performance is maintained, the volume for the pipes may be reduced.

Further, in the server apparatus 2 of the comparative technology, the distribution pipe 211 and the confluence pipe 221 are disposed in parallel to each other. In the server apparatus 1 of the present embodiment, it is possible to set the lengths of the distribution pipe $11_1$ and the confluence pipe $21_2$ to one half those of the distribution pipe 211 and the confluence pipe 221 of the server apparatus 2 of the comparative technology. Therefore, it is possible to dispose the distribution pipe $11_1$ and the confluence pipe $21_2$ in a vertical direction, for example, to dispose the distribution pipe $11_1$ and the confluence pipe $21_2$ such that the long axis SS of the distribution pipe $11_1$ and the long axis CS of the confluence pipe $21_2$ are aligned coaxially as depicted in FIGS. 2 and 3. Therefore, the installation space of the distributing device 10 and the confluence device 20 may be made smaller than that of the distributing device 210 and the confluence device 220 of the server apparatus 2 of the comparative technology.

The distributing device 10 and the confluence device 20 depicted in FIGS. 2 and 3 are formed from two-hierarchy distribution layer distributing device and confluence layer confluence device. However, the distributing device 10 and the confluence device 20 are not limited to those of the two-hierarchy type and may be formed from three or more hierarchies in accordance with the number of electronic apparatus 40 to be coupled.

Where hierarchies of a distribution layer distributing device are generalized as N hierarchies, the distribution layer distributing device $13_N$ includes a distribution pipe $11_N$ for temporarily storing refrigerant liquid and a plurality of distribution communication pipes $12_N$ that couple to a distribution pipe $11_{N+1}$ on the downstream side or electronic apparatus 40. It is to be noted that N is a hierarchy number and is an integer equal to or greater than 1, and it is assumed that N increases in a direction from the upstream side to the downstream side in which refrigerant liquid flows.

Further, also the confluence device 20 is not limited to a two-hierarchy configuration and may be formed from three or more hierarchies in accordance with the number of electronic apparatus 40 to be coupled. The confluence device 20 includes a confluence pipe $21_M$ for temporarily storing refrigerant liquid (M is a hierarchy number and increases in the direction from the upstream toward the downstream in which refrigerant liquid flows), and a plurality of confluence communication pipes $22_M$ that couple to the electronic apparatus 40 or the confluence pipes $21_{M-1}$ of the confluence layer confluence device on the upstream side. Each of the confluence pipes 21M includes a plurality of inflow ports and one exhaust port.

Figure 5:
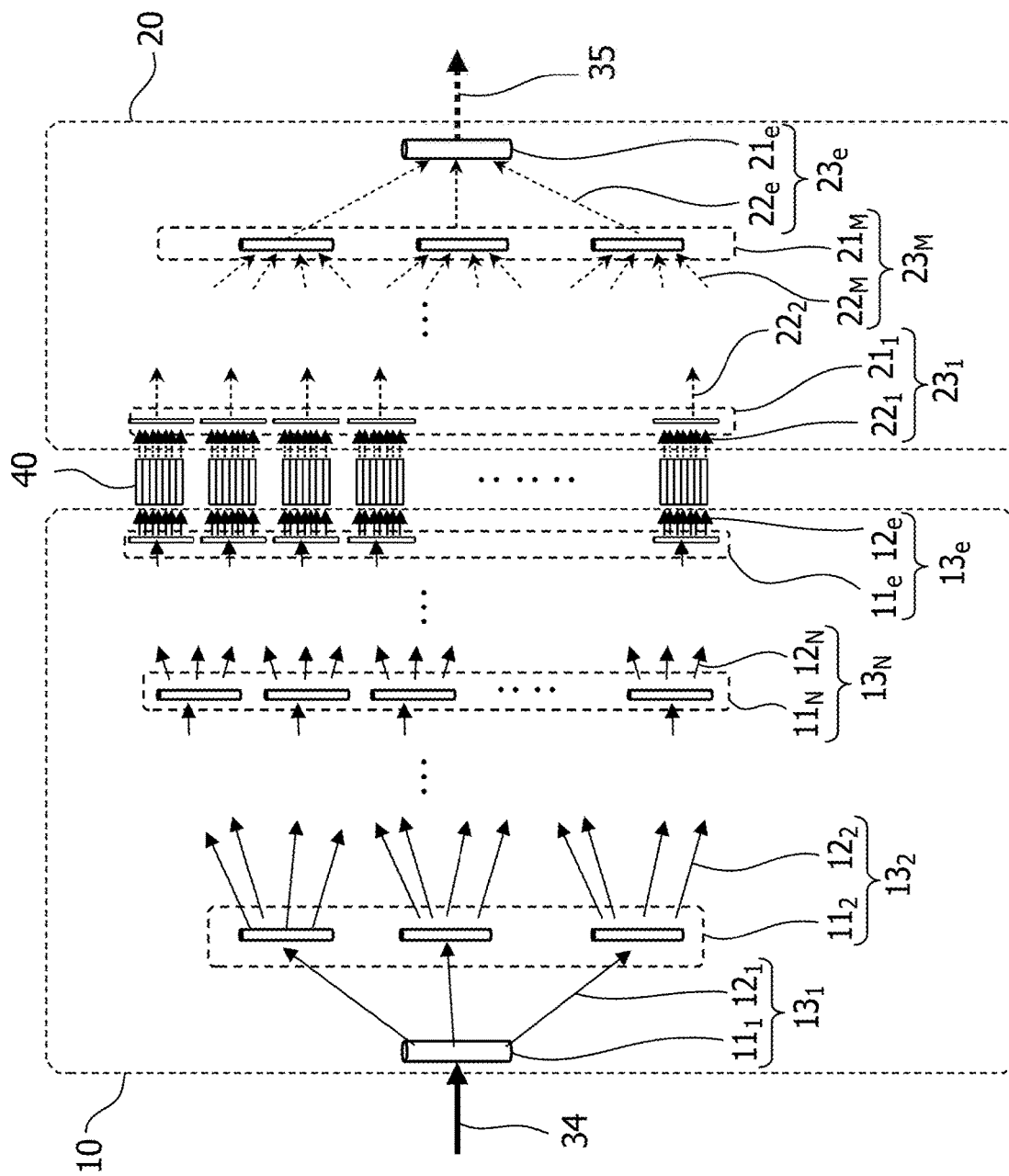
FIG. 5 is a conceptual view depicting that refrigerant liquid is distributed by a plurality of distribution layer distributing devices and are joined back by a plurality of confluence layer confluence devices.

FIG. 5 is a view depicting an overview of an information processing apparatus that includes three hierarchies or more of distribution layer distributing devices 13 and confluence layer confluence devices 23. An inflow layer that flows into the first distribution layer distributing device $13_1$ by the feed water pipe 34 from the left in FIG. 5 is distributed to the distribution pipe $11_1$ and flows into the second distribution layer distributing device $13_2$ through the distribution communication pipes $12_1$. The distribution of refrigerant liquid successively occurs up to the last hierarchy 13e and flows into individual ones of the electronic apparatus 40. The cooling water that has cooled the electronic apparatus 40 is collected by the confluence device 20. In the confluence device 20, the cooling water is collected for each group by the first confluence layer confluence devices $23_1$. After the distribution successively occurs up to the last hierarchy 23e, it is sent to the heat exchanger 33 through the drain pipe 35.

The hierarchy number of the distributing device 10 and the hierarchy number of the confluence device 20 may be substantially equal to each other or may be different from each other. For example, the distributing device 10 may be formed in three hierarchies while the confluence device 20 is formed in two hierarchies. Only the confluence device 20 may be formed in a single hierarchy.

In the case where the distributing device 10 is produced in a plurality of hierarchies, the diameter $SD_{N+1}$ of the distribution pipe $11_{N+1}$ of the N+1th distribution layer distributing device on the downstream side is formed smaller than the diameter $SD_N$ of the distribution pipe $11_N$ in the Nth distribution layer distributing device. Further, in the N+1th distribution layer distributing device, the diameter $TD_N$ of the distribution communication pipe $12_N$ is formed smaller than the diameter $SD_N$ of the distribution pipe $11_N$.

Further, taking the pressure loss upon distribution of refrigerant liquid into consideration, the diameter $SD_{N+1}$ of the distribution pipe $11_{N+1}$ of the N+1th distribution layer distributing device $13_{N+1}$ on the downstream side may be determined in accordance with the following expression:

$$SD_{N+1} = SD_N / V(SN_N) \quad \text{(Expression 2)}$$

where SDN is the diameter of the distribution pipe 11 in the Nth distribution layer distributing device, and $SN_N$ is a distribution number by the Nth distribution layer distributing device.

In the case where the confluence device 20 is formed from a plurality of hierarchies, the diameter $CD_{M-1}$ of the confluence pipe $24_{M-1}$ of the M−1th hierarchy is formed smaller than the diameter $CD_M$ of the confluence pipe $21_M$ of the Mth confluence layer confluence device (M is an integer equal to or greater than 2 and increases from the upstream side of refrigerant liquid toward the downstream side). For example, the diameter $CD_{M-1}$ of the confluence pipe $24_{M-1}$ of the M+1th hierarchy (on the downstream side) is formed greater than the diameter $CD_M$ of the confluence pipe $21_M$ of the Mth confluence layer confluence device. Further, in the Mth confluence layer confluence device, the diameter $UD_M$ of the confluence communication pipe $22_M$ is formed smaller than the diameter $CD_M$ of the confluence pipe $21_M$.

Further, the diameter $CD_{M+1}$ of the confluence pipe $21_{M+1}$ of the M+1th hierarchy may be determined in accordance with the following expression:

$$CD_{M+1} = CD_M \times \sqrt{(CN_{M+1})} \quad \text{(Expression 3)}$$

where $CD_M$ is the diameter of the pipe of the Mth confluence layer confluence device (layer on the upstream side), and $CN_{M+1}$ is a confluence number by which confluence streams of refrigerant liquid merge in the M+1th confluence layer confluence device (layer on the downstream side).

Figure 6:
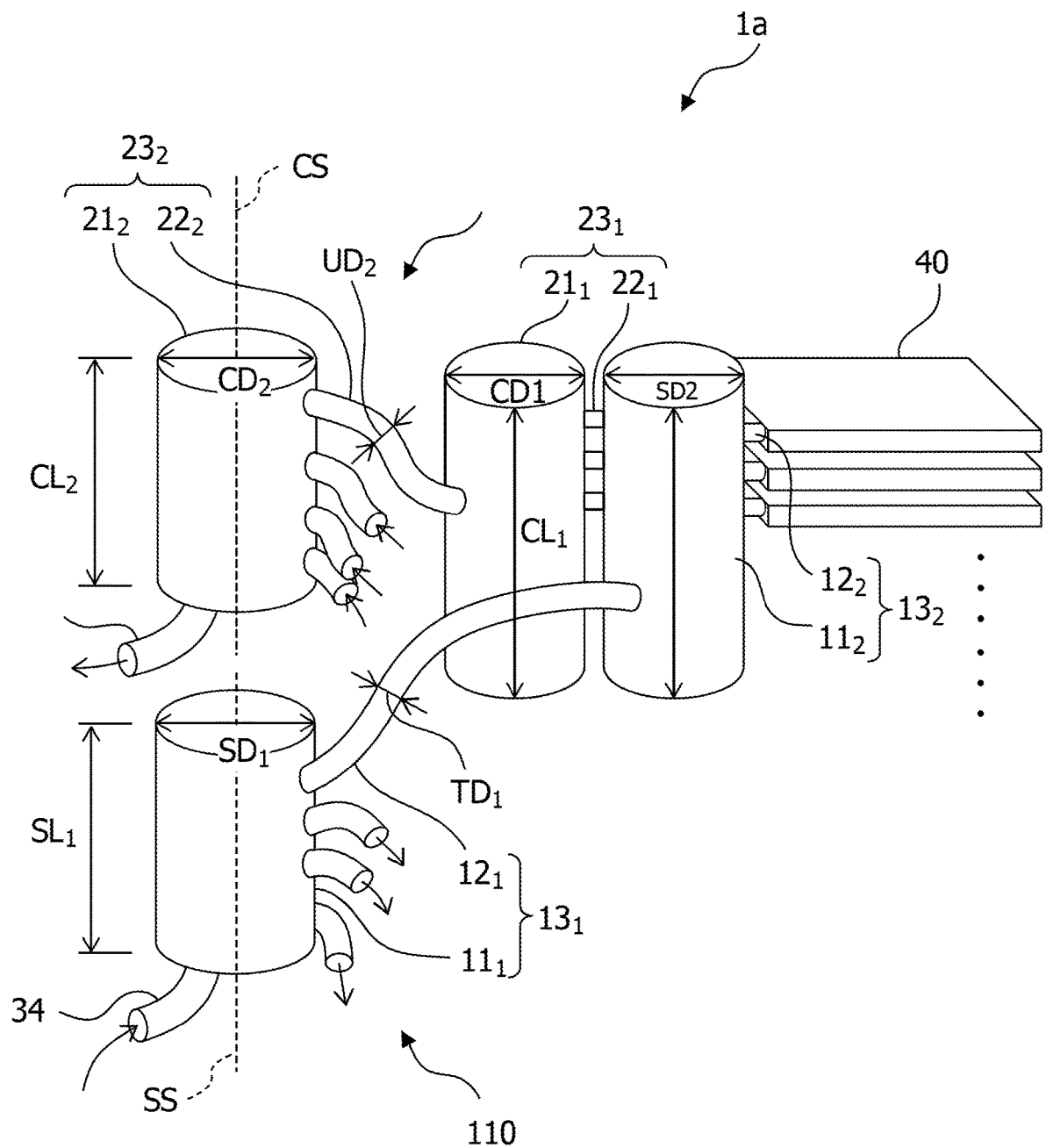
FIG. 6 is a view depicting a different example of an information processing apparatus and is a perspective view depicting part of a distributing device and a confluence device.

FIG. 6 depicts a server apparatus $1a$ that is a different example of the information processing apparatus of the present embodiment. In the server apparatus 1 depicted in FIGS. 2 and 3, the diameter $SD_2$ of the second distribution pipes $11_2$ used in the distributing device 10 is formed so as to be smaller than the diameter $SD_1$ of the distribution pipe $11_1$. On the other hand, in the distributing device 110 of the server apparatus $1a$ depicted in FIG. 6, the diameter $SD_1$ of the distribution pipe $11_1$ of the first distribution layer distributing device $13_1$ and the diameter $SD_2$ of the second distribution pipes $11_2$ of the second distribution layer distributing device $13_2$ are formed in a substantially equal magnitude. Since the distribution communication pipe $12_1$, distribution communication pipe$_s$ 122 and electronic apparatus 40 are same as those of the server apparatus 1 depicted in FIG. 3, overlapping description of them is omitted. The magnitudes (inner diameters) of the diameter $SD_1$ of the distribution pipe $11_1$ and the diameter $SD_2$ of the second distribution pipes $11_2$ depicted in FIG. 6 are preferably set to 1 to 200 mm.

Also in the confluence device 120 of the server apparatus $1a$ depicted in FIG. 6, the diameter $CD_1$ of the first confluence pipe $21_1$ of the first confluence layer confluence device $23_1$ and the diameter $CD_2$ of the second confluence pipe $21_2$ of the second confluence layer confluence device $23_2$ are formed in a same magnitude as in in the distributing device 110. Since the confluence communication pipe $22_1$ and the confluence communication pipe $22_2$ are same as those of the server apparatus 1 depicted in FIG. 3, overlapping description of them is omitted. The magnitudes (inner diameters) of the diameter $CD_1$ of the first confluence pipe $21_1$ and the diameter $CD_2$ of the second confluence pipe $21_2$ are preferably set to 1 to 200 mm. Further, the diameter $CD_1$ of the first confluence pipe $21_1$ and the diameter $SD_2$ of the second distribution pipe $11_2$ may have a same magnitude. It is to be noted that a same magnitude here includes magnitudes that may be regarded as substantially same in addition to magnitudes fully coincident with each other. For example, a difference in magnitude of, for example, 1 to 5 mm, which has no significant influence on the pressure loss of refrigerant liquid flowing through a pipe, is included in a same magnitude.

Although pipes of a substantially equal diameter are used for the first distribution pipe $11_1$ and the second distribution pipe $11_2$, the height $SL_1$ of the first distribution pipe $11_1$ and the height $SL_2$ of the second distribution pipe $11_2$ may be substantially equal to each other or may be different from each other. For example, one of the height $SL_1$ of the first distribution pipe $11_1$ and the height $SL_2$ of the second distribution pipe $11_2$ may be greater than the other one of them.

Although pipes of a substantially equal diameter are used for the first confluence pipe $21_1$ and the second confluence pipe $21_2$, the height $CL_1$ of the first confluence pipe $21_1$ and the height $CL_2$ of the second confluence pipe $21_2$ may be substantially equal to each other or may be different from each other. For example, one of the height $CL_2$ of the second confluence pipe $21_2$ and the height $CL_1$ of the first confluence pipe $21_1$ may be greater than the other one of them. This is because, although the pressure loss of refrigerant liquid flowing in the distributing device 110 or the confluence device 120 varies depending upon the diameter ($CD_1$, $CD_2$, $SD_1$ or $SD_2$) of the pipe, the influence of the difference in length of them, for example, the influence of the difference in height ($SL_1$, $SL_2$, $CL_1$ or $CL_2$) of the pipes, is less.

Since, in the server apparatus $1a$ depicted in FIG. 6, the diameter $SD_1$ of the first distribution pipe $11_1$ and the diameter $SD_2$ of the second distribution pipe $11_2$ are substantially equal in magnitude, the pressure loss little differs. Therefore, if the plurality of first distribution communication pipes $12_1$ that communicate the distribution pipe $11_1$ and the plurality of second distribution pipes $11_2$ with each other are made substantially equal in length and diameter $TD_1$, refrigerant liquid may be supplied at a fixed flow rate to each of the second distribution pipes 112. Further, even if the length of the distribution communication pipe $12_1$ changes, the supply amount of refrigerant liquid to the second distribution pipes $11_2$ may be controlled by changing the diameter $TD_1$ of the first distribution communication pipe $12_1$ or by providing a function for adjusting the pressure loss such that the pressure loss is adjusted. Therefore, for example, even if the number of branches from the first distribution pipe $11_1$ increases, this may be designed readily.

Further, by making the diameter $SD_1$ of the first distribution pipe $11_1$ and the diameter $SD_2$ of the second distribution pipe $11_2$ substantially equal in magnitude, the first distribution pipe $11_1$ and the second distribution pipe $11_2$ may be prepared in same specifications. Since the first distribution pipe $11_1$ and the second distribution pipe $11_2$ are prepared in same specifications, the purchase amount of pipe members to be used for the distribution pipe $11_1$ and so forth increases, and therefore, the unit prices decreases and the supply cost may be reduced. It is considered that similar advantageous effects are provided also by the first confluence pipe $21_1$ and the second confluence pipe $21_2$ of the confluence device 120 of the server apparatus $1a$.

A setting method of the branch number $B_N$ to be branched from the distribution layer distributing device 13 of each distributing device in the server apparatus of the present embodiment is described with reference to FIGS. 7 to 10. In a server apparatus $1b$ depicted in FIG. 7, refrigerant liquid is branched according to the quantity of electronic apparatus 40 to be cooled. However, in the case where refrigerant liquid is branched separately into a plurality of hierarchies N, the length TL of distribution communication pipes 12 branched from the distribution pipe 11 differs depending upon to what degree the refrigerant liquid is to be branched in each hierarchy. Therefore, in the server apparatus $1b$ of the present embodiment, the branch number $B_N$ in each hierarchy is set, in response to a value determined by (1/hierarchy number T)th power of the total branch number R, as a combination of factors of the total branch number R closest to the value. For example, a value obtained using the expression given below (expression 4) is used to set a combination of branch number $B_N$ of the distribution communication pipes $12_N$ of the Nth hierarchy:

$$B_N \approx R^{\wedge}(1/T) \ldots ((1/T)\text{th power of } R) \quad \text{(Expression 4)}$$

where R is the total number of branches, N the hierarchy number, T the number of hierarchies, and R, T and N are integers equal to or greater than 2.

As the branch number in the Nth hierarchy, a value proximate to a factor of the total branch number R is selected. For example, an integer included in a given range centered at a value α determined by the expression 4 is selected as a branch number. The given range is, for example, a range within ±α/2 from the value α determined by the expression 4.

Figure 7:
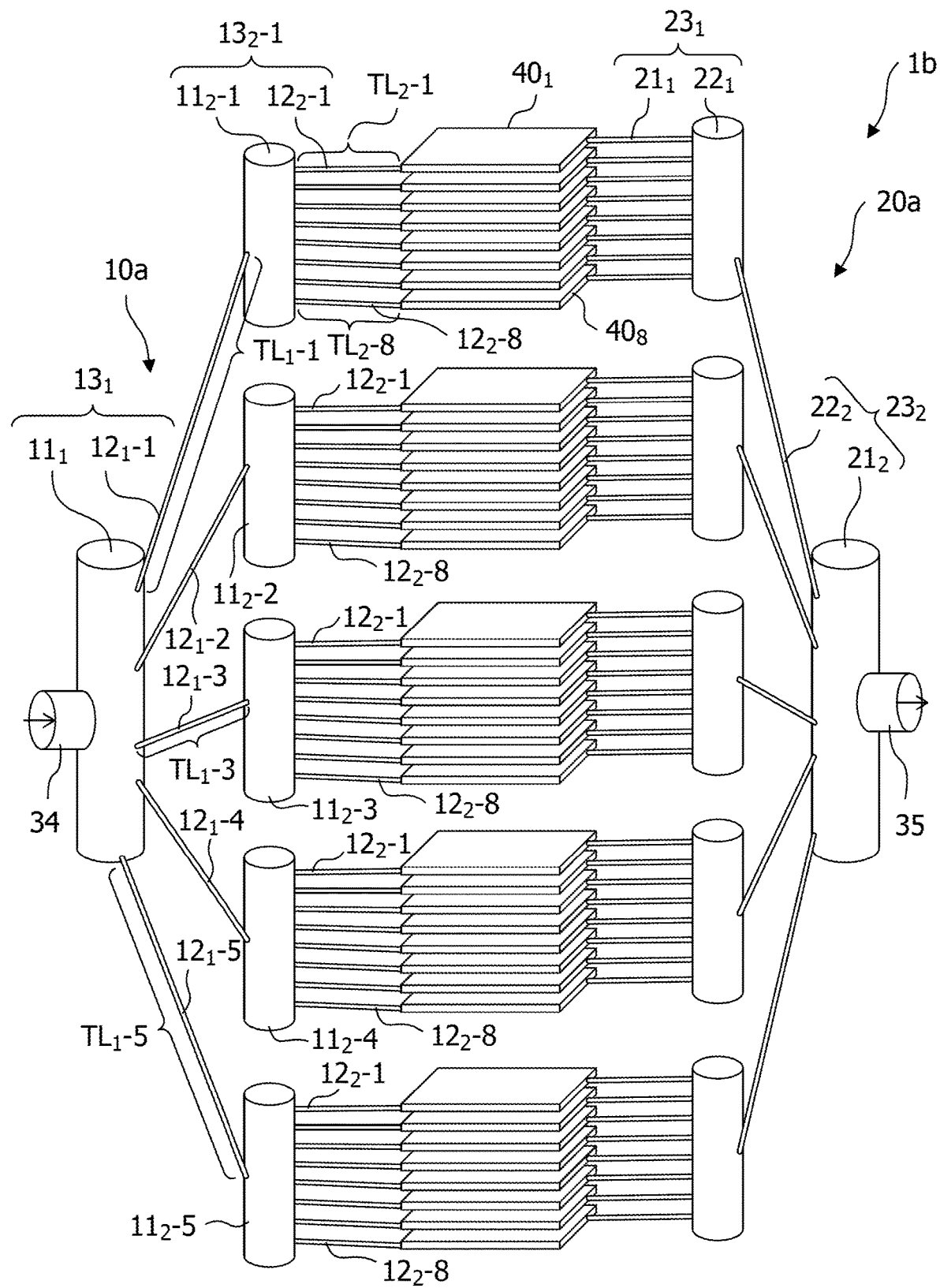
FIG. 7 is a schematic view depicting an example of a distributing device and a confluence device of an information processing apparatus.

For example, in the case where 40 electronic apparatus 40 are to be cooled as depicted in FIG. 7, the total branch number R is 40. Further, in the case where the hierarchy number T is 2, the branch number $B_N$ of each hierarchy is set so as to have a value proximate to $40^{\wedge}(\frac{1}{2}) \approx 6$ determined from the expression 4. In the case where the total branch number R is 40, as combinations of factors of 40, if a combination is represented in the form of (branch number $B_1$ of the first hierarchy)×(branch number $B_2$ of the second hierarchy), there are six combinations of (1) 2×20, (2) 4×10, (3) 5×8, (4) 8×5, (5) 10×4 and (6) 20×2.

Figure 8:
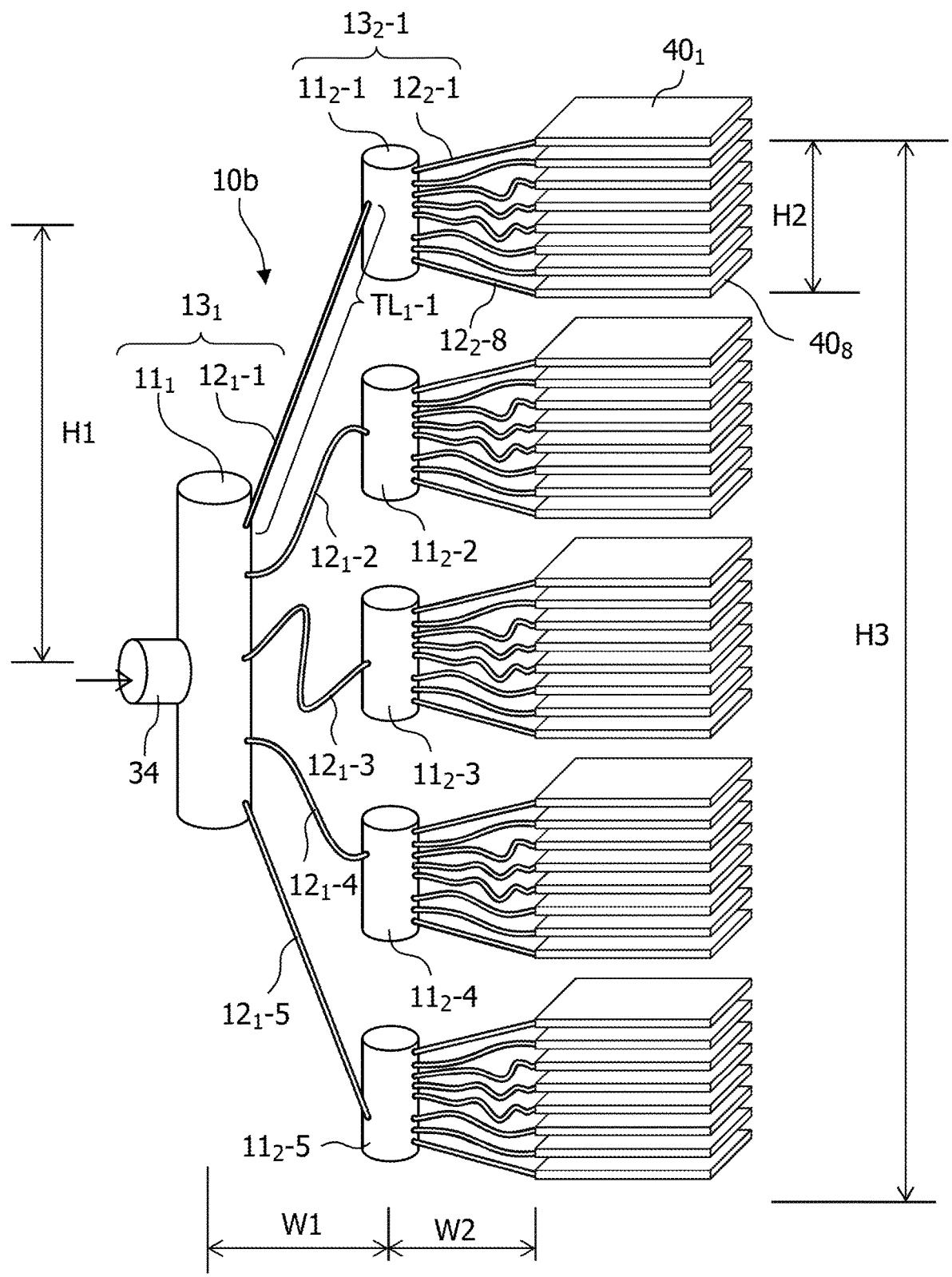
FIGS. 8 to 10 are schematic views depicting different examples of a distributing device of an information processing apparatus.
Figure 9:
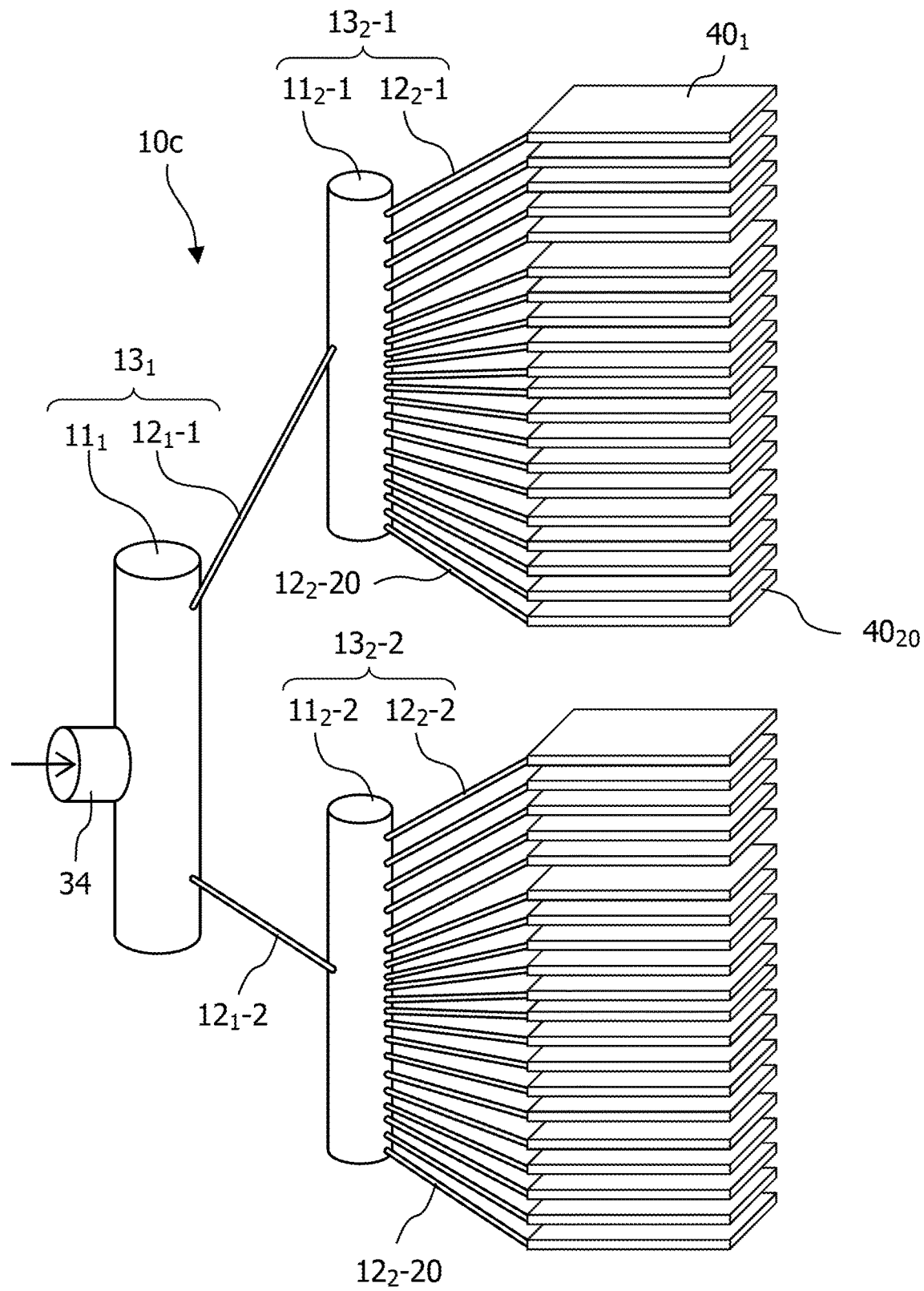
Figure 10:
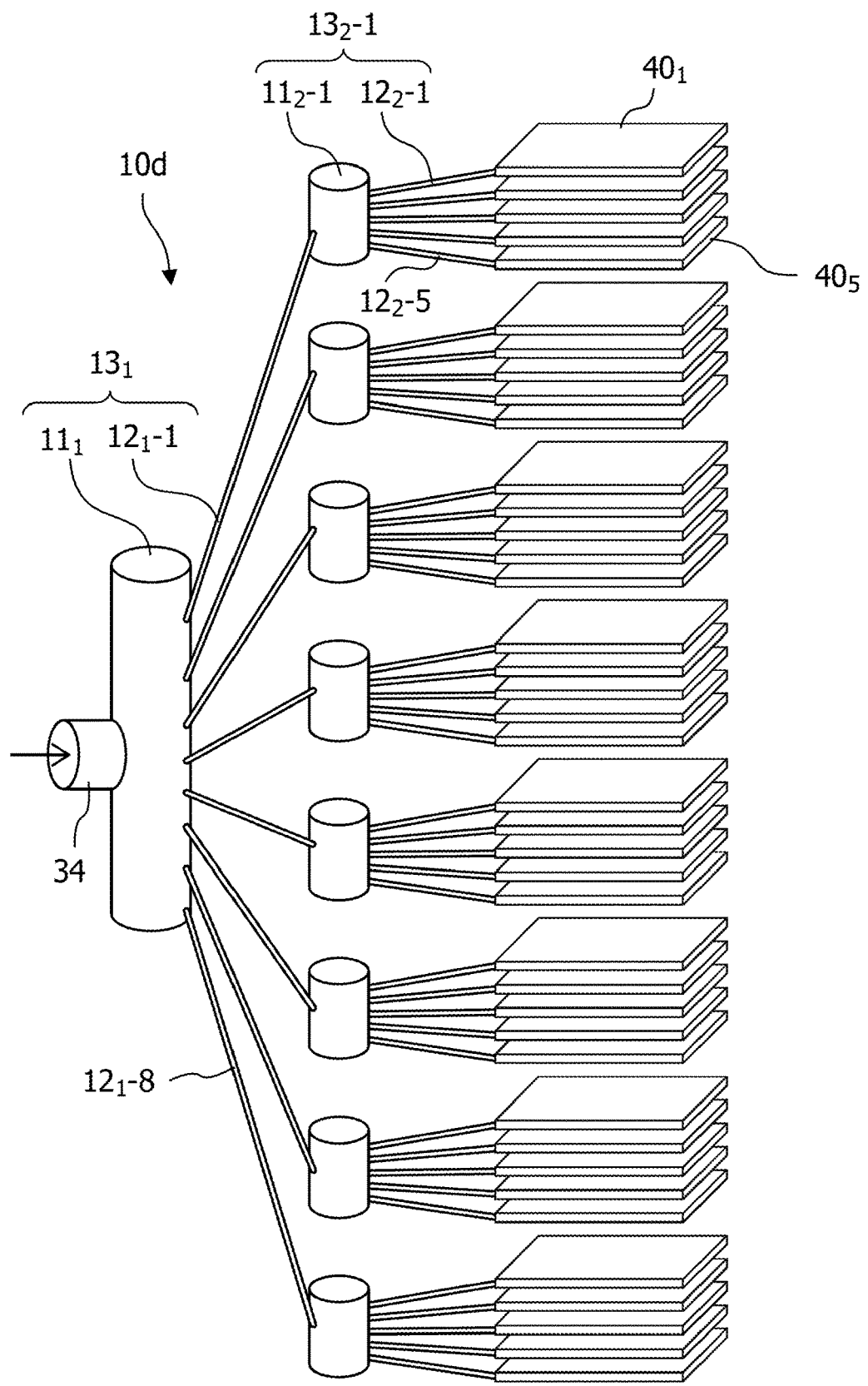

Of the six combinations, the combination of 5×8 and the combination of 8×5 are proximate to the value α≈6 calculated in accordance with the expression 4 for the branch numbers $B_1$ and $B_2$. The combinations may be selected, for example, from that the branch numbers $B_1$ and $B_2$ are included in the range of ±3 centered at 6, for example, within the range from 3 to 9. FIGS. 7 and 8 depict distributing devices 10a and 10b that include branches of the combination of 5×8. FIG. 9 depicts a distributing device 10c that includes branches of the combination of 2×20. FIG. 10 depicts a distributing device 10d that includes branches of the combination of 8×5. It is to be noted that FIG. 7 depicts the confluence device 20a configured from a first confluence layer confluence device $23_1$ in which eight confluence communication pipes $22_1$ are used for confluence in the first hierarchy and a second confluence layer confluence device $23_2$ in which five confluence communication pipes 222 are used for confluence in the second hierarchy by a method similar to that of the distributing device 10a. It is to be noted that, although a confluence device is provided also in the servers depicted in FIGS. 8 to 10, such confluence devices are omitted in FIGS. 8 to 10.

The length TL over which a distribution communication pipe 12 is coupled to a distribution pipe 11 on the downstream side differs among different hierarchies. Therefore, for example, in the distributing device 10a depicted in FIG. 7, since the first hierarchy includes five branches, five pipes of different lengths from one another are prepared for the distribution communication pipes $12_{1-1}$ to $12_{1-5}$. Meanwhile, in the second hierarchy, since the distances between the distribution pipes $11_{2-1}$ and the electronic apparatus 40 are individually different from one another, eight pipes of different lengths from one another are prepared for each of the distribution layer distributing devices $13_{2-1}$ to $13_{2-5}$. In short, in the combination of 5×8, 13 pipes of different lengths from one another are prepared (hereinafter referred to each as branch type of a distribution communication pipe 12). If the number of branch types is calculated for each of the six combinations described above, such results as given below are obtained.

(1) 2×20: $B_1$=2, $B_2$=20, $B_1$+$13_2$=2+20=22
(2) 4×10: $B_1$=4, $B_2$=10, $B_1$+$B_2$=4+10=14
(3) 5×8: $B_1$=5, $B_2$=8, $B_1$+$B_2$=5+8=13
(4) 8×5: $B_1$=8, $B_2$=5, $B_1$+$B_2$=8+5=13
(5) 10×4: $B_1$=10, $13_2$=4, $B_1$+$13_2$=10+4=14
(6) 20×2: $B_1$=20, $13_2$=2, $B_1$+$13_2$=20+2=22 where $B_1$ is a branch number of the first hierarchy, and $B_2$ is a branch number of the second hierarchy.

In the case where a distributing device is produced, the production cost may be reduced by reducing the number of branch types of distribution communication pipes. In the case where the total branch number R is 40, both of the branch numbers of (3) and (4) are 13 and are smaller than those of (1), (2), (5) and (6). Therefore, it is considered that, in the case where the total branch number R is 40, the combinations (3) and (4) are most desirable.

As depicted in FIG. 7, the distribution pipes of the different hierarchies may be coupled by distribution communication pipes formed linearly. However, since the linear distances to the distribution pipes $11_2$-1 to $11_2$-5 of the second hierarchy branched from the distribution pipe $11_1$ of the first hierarchy are different from each other, the lengths $TL_1$-1 to $TL_1$-5 of the distribution communication pipes of the first hierarchy are different from one another. Further, since also the linear distances, for example, from the distribution pipe $11_2$-1 of the second hierarchy to the electronic apparatus $40_1$ to $40_8$ are different from one another, the lengths $TL_2$-1 to $TL_2$-8 of the distribution communication pipes $12_2$-1 to $12_2$-8 of the second hierarchy are different from one another. Therefore, as a value of pressure loss of refrigerant liquid that passes a distribution communication pipe, there are 5+8=13 values. If the pressure loss differs, the flow rate of refrigerant liquid that is to cool an electronic apparatus, from which heat is generated, at a terminal end of the distribution communication pipe differs. Therefore, it is desirable to unify the pressure loss as far as possible in order to cool all electronic apparatus 40 in a similar manner. For example, in the case where the distribution pipe $11_1$ of the first hierarchy is near in position to the distribution pipe $11_2$-3 of the second hierarchy as depicted in FIG. 8, to the length $TL_1$-1 of the distribution communication pipe having the greatest linear distance, the length of the other distribution communication pipes is unified. In this case, the other distribution communication pipes each having an increased length are coupled making a roundabout with respect to the linear distance.

It is to be noted that the pressure loss ΔP in a circular pipe may be calculated in accordance with the formula of Darcy-Weisbach:

$$\Delta P = \lambda * TL/TD * \rho u^2/2 = 4f * TL/TD * \rho u^2/2 \quad \text{(Expression 5)}$$

where TL is the length (unit: m) of the distribution communication pipe, TD the inner diameter (unit: m) of the circular pipe, p the fluid density (unit: kg/m³), u the flow rate (unit: m/s), λ the friction loss coefficient of Darcy, and F a friction coefficient of Fanning and λ=4f.

From the expression 5, it may be recognized that the pressure loss ΔP changes in proportion to the length TL of the distribution communication pipe 12. Since the pressure loss increases as the length of the distribution communication pipe 12 increases, it is sometimes difficult to cool all of the electronic apparatus 40 unless the capacity of a pump of a Refrigerant liquid Distribution Unit (hereinafter referred to as CDU) that supplies refrigerant liquid is increased. For example, as the total length increases, the enhancement of the CDU is demanded to supply refrigerant liquid with same pressure. Therefore, the equipment cost relating to the CDU sometimes increase in addition to the cost for preparation of the distribution communication pipe 12. If the technology of the present disclosure optimizes the branch numbers, the cost for preparation of the distribution communication pipes 12 is minimized and also the equipment cost of the CDU may be minimized.

Where a combination includes many branch types, in order to unify the pressure loss, the pipe lengths of the distribution communication pipes 12 are unified to that of the distribution communication pipe 12 that has the longest pipe length, and therefore, the total length of the distribution communication pipes 12 becomes long. In the case where the total branch number R is 40, the combination of 2×20 and the combination of 20×2 include 22 branch types, and the number of branch types is greater by approximately 70% in comparison with 13 branch types in the combination of 5×8 and the combination of 8×5.

Where the total length of the distribution communication pipes 12 was calculated in regard to the case of the combination of 2×20 (refer to FIG. 9) and the case of the combination of 5×8 (refer to FIGS. 7 and 8), results depicted in Table 3 and Table 4 were obtained. It is to be noted, however, that the distance W1 between the distribution pipe $11_1$ of the first hierarchy and the distribution pipe $11_2$ of the second hierarchy and the distance W2 from the distribution pipes $11_2$ of the second hierarchy to the electronic apparatus 40 are set to 10 cm. Further, the difference in height from the center of the distribution pipe $11_1$ of the first hierarchy to the center of the distribution pipes $11_2$ of the second hierarchy is set to H1. The height H2 where eight electronic apparatus 40 coupled individually to the distribution pipes $11_2$-1 to $11_2$-5 of the second hierarchy are piled up is set to 30 cm, and the height H3 where all of 40 electronic apparatus 40 are piled up is set to 150 cm.

(1) In the case of 2×20

TABLE 3

| 2 branches of first hierarchy | | | |
|---|---|---|---|
| First hierarchy | TL1-1 | TL1-2 | Total |
| Linear distance (cm) | 38.8 | 38.8 | 77.6 |
| Adjustment length (cm) | 0.0 | 0.0 | 0.0 |
| 20 branches of second hierarchy | | | | | | | | | | |
| Second hierarchy | TL2-1 | TL2-2 | TL2-3 | TL2-4 | TL2-5 | TL2-6 | TL2-7 | TL2-8 | TL2-9 | TL2-10 |
| Linear distance (cm) | 37.0 | 33.4 | 29.8 | 26.3 | 22.9 | 19.6 | 16.5 | 13.7 | 11.5 | 10.2 |
| Adjustment length (cm) | 0.0 | 3.6 | 7.2 | 10.7 | 14.1 | 17.4 | 20.5 | 23.3 | 25.5 | 26.8 |
| Second hierarchy | TL2-11 | TL2-12 | TL2-13 | TL2-14 | TL2-15 | TL2-16 | TL2-17 | TL2-18 | TL2-19 | TL2-20 | Total |
| Linear distance (cm) | 10.2 | 11.5 | 13.7 | 16.5 | 19.6 | 22.9 | 26.3 | 29.8 | 33.4 | 37.0 | 442.0 |
| Adjustment length (cm) | 26.8 | 25.5 | 23.3 | 20.5 | 17.4 | 14.1 | 10.7 | 7.2 | 3.6 | 0.0 | 298.0 |

(3) In the case of 5×8

TABLE 4

| First hierarchy | TL1-1 | TL1-2 | TL1-3 | TL1-4 | TL1-5 | Total |
|---|---|---|---|---|---|---|
| 5 branches of first hierarchy | | | | | | |
| Linear distance (cm) | 60.8 | 31.6 | 10.0 | 31.6 | 60.8 | 194.9 |
| Adjustment length (cm) | 0.0 | 29.2 | 50.8 | 29.2 | 0.0 | 109.2 |
| 8 branches of second hierarchy | | | | | | |
| Linear distance (cm) | 60.8 | 31.6 | 10.0 | 31.6 | 60.8 | 194.9 |
| Adjustment length (cm) | 0.0 | 29.2 | 50.8 | 29.2 | 0.0 | 109.2 |

Where the total length of the distribution communication pipes 12 in the combination of 2×20 and the total length of the distribution communication pipes 12 in the combination of 5×8 are compared, the following result is obtained.

TABLE 5

| Branch type | Total length (cm) | After adjustment (cm) | Increasing amount (cm) |
|---|---|---|---|
| 5 × 8 | 713.5 | 964.2 | 250.7 |
| 2 × 20 | 961.6 | 1557.7 | 596.1 |

If the lengths of the distribution communication pipes 12 of same hierarchies in the distributing device 10a depicted in FIG. 7 are adjusted to the distribution pipe length of the distribution communication pipe having the greatest length as in the distributing device 10b depicted in FIG. 8, the total length of the distribution communication pipes 12 after adjustment indicates increase of 250.7 cm. Further, if the distributing device 10b depicted in FIG. 8 and the distributing device 10c depicted in FIG. 9 are compared with each other, the total length of the distribution communication pipes 12 increases by 596.1 cm. For example, if the combination of 2×20 and the combination of 5×8 are compared with each other, in the case of the combination of 2×20, also the increasing amount of the total length of the distribution communication pipes 12 is great, and the occupation space of the distribution communication pipes 12 and the cost of the distribution communication pipes 12 increase.

FIG. 10 depicts a distributing device 10d configured from the combination of 8×5 in the case where the total branch number R is 40. Between the distributing device 10a of 5×8 depicted in FIG. 7 and the distributing device 10d of 8×5 depicted in FIG. 10, the sum of branch types is substantially equal and 13. In the distributing device 10d of FIG. 10, the quantity of distribution communication pipes 12₂ branched in the second hierarchy is 40 same as the configurations depicted in FIGS. 7 to 9. However, the number of distribution communication pipes 12₁-1 to 12₁-8 that are branched in the first hierarchy is 8 and is greater than 5 of the number of the distribution communication pipes 12₁-1 to 12₁-5 of the distributing device 10a that are branched in the first hierarchy depicted in FIG. 7. Therefore, the value when the lengths of the distribution communication pipes 12₁-1 to 12₁-8 depicted in FIG. 10 are summed is greater. Where the number of distribution communication pipes on the upstream side is made smaller as in the distributing device 10a depicted in FIG. 7, the occupation space by the distribution communication pipes 12 decreases, and the cost for preparation of parts may be reduced.

While the distributing devices 10a to 10d depicted in FIGS. 7 to 10 are depicted to a case in which the total branch number R is 40 and the hierarchy number T is 2, the total branch number R and the hierarchy number T are not limited to them and may have different values. For example, in the case where the total branch number R is 96 and the hierarchy number T is 2, the value α indicated by the expression 4 is approximately 10. The combination of factors proximate to the value α is either (1) the combination in which the branch number B₁ branched in the first hierarchy is 8 and the branch number B₂ branched in the second hierarchy is 12 or (2) the combination in which the branch number B₁ is 12 and the branch number B₂ is 8. The combination in which the branch number is smaller in the hierarchy on the upstream side is (1) the combination in which the branch number B₁ is 8 and the branch number B₂ is 12. By setting the branch numbers in this manner, the total length of the distribution communication pipes may be reduced.

Further, the method for setting branch numbers described above may be utilized also when the confluence number $G_M$ of each hierarchy M in the confluence device 20a depicted in FIG. 7 is determined. For example, in the confluence device 20a depicted in FIG. 7, where the total flow number is V and the hierarchy number is M, a combination of the confluence number $G_M$ of the confluence communication pipes 22$_M$ of the Mth hierarchy is set utilizing a value obtained using the following expression (6):

$$G_M \approx V^{\wedge}(1/T)((1/T)th \text{ power of } V) \tag{Expression 6}$$

where V is the total flow number, M the hierarchy number, and T the number of hierarchies. In the case where the total flow number V is 40, the combinations of the confluence number of the first hierarchy×confluence number of the second hierarchy are the combination of 8×5 and the combination of 8×5. By applying the combination of 8×5, the confluence number in the hierarchy on the downstream side decreases, and the occupation space by the confluence communication pipes 22₂ decreases and the cost for preparation of parts is reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An information processing apparatus comprising: a plurality of electronic apparatus stacked over a plurality of hierarchies in the information processing apparatus; a heat exchanger that cools refrigerant liquid for cooling the plurality of electronic apparatus; a first distributor that distributes the refrigerant liquid from the heat exchanger to the plurality of hierarchies; a plurality of second distributor that stores the refrigerant liquid temporarily; and a plurality of pipes that branched from the distribution pipes to the plurality of electronic apparatus, the number of the second distributor increases toward a hierarchy on downstream side, the plurality of pipes of a last hierarchy of the plurality of hierarchies are coupled to the plurality of electronic apparatus, and the number BN of branches that are branched from the second distributor of the Nth hierarchy is the closest to the number defined by the following expression among combinations of the number of branches of each distributor: BN≈R^(1/T)) . . . ((1/T)th power of R) where BN, R and T are integers equal to or greater than 2, R indicates a total number of the plurality of electronic apparatus, and T indicates a number of hierarchies of branches for distributing the refrigerant liquid between the first distributor and the plurality of electronic apparatus.

2. The information processing apparatus according to claim 1, wherein each of the plurality of pipes branched from the second distributor of each hierarchy is formed with a same length as a distance from the second distributor of the hierarchy to the second distributor of the next hierarchy positioned farthest from the distribution pipe of the hierarchy.

3. The information processing apparatus according to claim 1, wherein the number of branches from the second distributor of each hierarchy is set so as to increases toward the second distributor positioned on the downstream side.

* * * * *